(12) United States Patent
Jayaraman

(10) Patent No.: US 10,014,876 B1
(45) Date of Patent: Jul. 3, 2018

(54) HIGH SPEED BUFFERING FOR TIME-INTERLEAVED ADCS WITH REDUCED ISI AND INCREASED VOLTAGE GAIN

(71) Applicant: Applied Micro Circuits Corporation, Sunnyvale, CA (US)

(72) Inventor: Nanda Govind Jayaraman, Santa Clara, CA (US)

(73) Assignee: MACOM Connectivity Solutions, LLC, Lowell, MA (US)

(*) Notice: Subject to any disclaimer, the term of this patent is extended or adjusted under 35 U.S.C. 154(b) by 0 days.

(21) Appl. No.: 15/451,194

(22) Filed: Mar. 6, 2017

(51) Int. Cl.
H03M 1/06 (2006.01)
H03M 1/12 (2006.01)
H03M 1/38 (2006.01)

(52) U.S. Cl.
CPC ........... H03M 1/38 (2013.01); H03M 1/1215 (2013.01); H03M 1/1245 (2013.01)

(58) Field of Classification Search
CPC ..................................................... H03M 1/38
USPC ................................ 341/118, 120, 155, 122
See application file for complete search history.

(56) References Cited

U.S. PATENT DOCUMENTS 7,221,192 B1* 5/2007 Talbot ................ G01R 31/3163
327/407

2013/0112853 A1* 5/2013 Suyama ............ H01L 27/14843
250/208.1
2013/0194118 A1* 8/2013 Coln .................... H03M 1/0682
341/155
2014/0292551 A1* 10/2014 Kull ....................... H03M 1/121
341/141

OTHER PUBLICATIONS

"Energy-Efficient High-Speed SAR ADC's in CMOS" Kull, et al. Springer International Publishing Switzerland 2015 19 pages.
"A 150-MS/s 8-b 71-mW CMOS Time-Interleaved ADC" Kulchycki,e t al. IEEE Journal of Solid-State Circuits, vol. 40, No. 5, May 2005 11 pages.
"Time-Interleaved Track and Holds" Chapter 2 Springer Science+Business Media B.V. 2011 35 pages.

* cited by examiner

Primary Examiner — Peguy Jean Pierre

(57) ABSTRACT

System and method of buffering sampled signals in a time-interleaved analog-to-digital converter (ADC). When the input voltage to the buffer varies to a different level, a constant reset voltage is supplied to the buffer output that drives a large capacitive load, e.g., composed of an array of sub-ADCs. The reset voltage functions to remove the capacitive effect from a previous output value on the load. As a result, the buffer can buffer the input for the load without introducing intersymbol interference (ISI). A reset switch can be used to control the supply of the reset voltage to the buffer output according to a predetermined clock signal. The reset voltage may be the common mode potential in a differential source follower in the buffer. An additional voltage gain can be advantageously achieved by the buffer with a gain factor being independent of the load capacitance.

19 Claims, 9 Drawing Sheets

US 10,014,876 B1

HIGH SPEED BUFFERING FOR TIME-INTERLEAVED ADCS WITH REDUCED ISI AND INCREASED VOLTAGE GAIN

TECHNICAL FIELD

The present disclosure relates generally to the field of signal processing in communications and, more specifically, to the field of analog-to-digital conversion in signal processing.

BACKGROUND OF THE INVENTION

In communication networks, high-speed digital receivers use analog-to-digital converters (ADCs) to convert a received signal into a digital form which allows a receiver to employ complex equalization logic. Usually, longer equalization is needed for higher signaling constellations and tougher channels. Thus, fast yet energy efficient ADCs are needed in high-speed digital receivers. A typical high-speed ADC resolution is between 5 to 8 bits.

ADCs with more than 6-bit precision running at several GHz are impractical to build as a single-channel ADC. Hence, typically, a number of slower ADCs are interleaved to overcome the speed limitation of a single-channel ADC. Successive-approximation-register (SAR) ADCs exhibit superior energy efficiency for medium-resolution applications.

Typically, a time-interleaved ADC uses a sampling and interleaving stage to receive and distribute input analog signals. More specifically, an input analog signal is demultiplexed by a first bank of switches, and sampled and held by another bank of switches. A sampled voltage is held on a storage capacitor at a designated point of time, and then buffered in a buffer circuit, for example, made of a source follower. The buffered voltage is supplied to a massive array of sub-ADCs through a set of output de-multiplexers. The N sub-ADCs are configured to perform analog-to-digital conversion in parallel, thereby offering N times higher conversion rates and input frequencies than if used non-interleaved.

However, due to the very large load capacitance from the succeeding ADC blocks, this type of signal chain has a major problem in that the buffer output is usually too slow to follow the high-speed input signal, leading to undesired Inter-Symbol Interference (ISI).

FIG. 1 illustrates the configuration of a buffer 100 in the sampling and interleaving stage of an individual channel in a time-interleaved ADC in accordance with the prior art. Diagram 160 shows the timing waveforms in various components in FIG. 1. The buffer circuit 100 may be used to buffer multiple sub-ADCs sequentially. The load of the buffer circuit 100 is collectively represented by the capacitor $C_{huge}$ 120.

The input analog signal $V_{in}$ is fed to a switch 140 which represents the combination of multiple demultiplexers and sampling and hold (S/H) switches. This switch 140 may be referred as a sampling switch herein. The switch 140 operates to select the buffer 100 and the associated sub-ADCs at a certain time window.

The buffer 100 is drawn at the transistor level using a PMOS source follower as an example. Only the half circuit is shown here. The same response problem applies to the NMOS version of the circuit. The full circuit is pseudo-differential with another copy that carries the inverted signal.

In time period as described herein, assuming that the buffer 100 starts with a settled condition, where all transients have died out and the sampling switch (SW) 140 is on. The source-to-gate voltage ($V_{sg}$) of the buffer 100 then assumes a certain value that follows from its bias current which is a positive value $V_{sg0}$. The parasitic capacitance at the gate node 112 of the transistor is represented as $C_{tiny}$ 130. The drain node 111 is coupled to the ground and the source node 113 is coupled to a current source 115.

Assuming at the beginning of the $n_{th}$ cycle, the input voltage ($V_{in}$) transitions to a different level, e.g., is stepped down (as shown in the waveform 162), thus $\Delta V = V_{in}(n-1) - V_{in}(n)$ (positive number). The gate node voltage $V_g$ at 112 can follow the variation of the input voltage ($V_{in}$) quickly (as shown in the waveform 164) because the capacitance $C_{tiny}$ at this node is very small. In contrast, the source node voltage $V_s$ (as shown in the waveform 163) follows very slowly due to the large load capacitance ($C_{huge}$) of the connected ADC bank and the interconnect network (not explicitly shown). For simplicity, the diagram 163 approximates $V_s$ as staying constant during the initial transient, though it moves at some slow rate in reality. The net effect is that $V_s - V_g$ becomes larger than $V_{sg0}$ after the applied step.

Next, the switch 140 (SW) turns off and the buffer 100 takes some time to settle. When settling is complete, $V_{sg}$ returns to the same steadystate value $V_{sg0}$ that it started out with, e.g., by drawing additional charge to $C_{sg}$ 114. On the source side, this charge is readily available, since this node is resistive. However, at the gate side, the charge can only come via charge conservation from the node's parasitic capacitance $C_{tiny}$ 130. Hence the gate node voltage $V_s$ gets pulled down by an amount equal to $ISI = \Delta V \cdot C_{sg}/C_{tiny} = \Delta V \cdot k$. In the discrete time domain, the buffer output voltage $V_s(n)$ is represented as:

$$V_s(n) = V_{in}(n) + V_{sg0} - ISI \qquad \text{(Equation 1)}$$

$$V_s(n) = V_{in}(n) + V_{sg0} - k(V_{in}(n-1) - V_{in}(n)) \qquad \text{(Equation 2)}$$

$$V_s(n) = V_{in}(n)(1+k) - kV_{in}(n-1) + V_{sg0} \qquad \text{(Equation 3)}$$

As shown in the Equations 1-3, the buffer output voltage $V_s(n)$ is a function of $V_{in}(n-1)$, meaning that the output signal has ISI.

FIG. 2 illustrates sample data plots of ADC frequency responses obtained by using the buffer shown in FIG. 1. The curve 210 shows the frequency response caused by the negative ISI term $kV_{in}(n-1)$. The curve 220 shows the finite acquisition bandwidth of the ADC front-end. The curve 230 shows the overall ADC frequency response which combines the ISI and the finite acquisition bandwidth. This response is undesired because it would take extra digital system resources to equalize it.

FIG. 3 illustrates the configuration of a buffer 300 in the sampling and interleaving stage in a time-interleaved ADC where the buffer 300 is capable of outputting a signal without ISI in accordance with the prior art. Compared with the buffer 100 shown in FIG. 3, the buffer 300 additionally includes a switch SWO 350 operable to isolate the large load capacitance $C_{huge}$ while the input $V_1$ is supplied. In this configuration, the turning-on of SWO 350 and the initial condition of $C_{huge}$ 320 have no effect on the final output value $V_s$ as long as the circuit is given enough time to settle. Thus both the gate $V_g$ and source voltages $V_s$ can follow quickly, and the analyzed ISI effect no longer occurs due to charge conservation at the gate node of the transistor, which defines the settling value. In this configuration, the buffer output voltage can be expressed as $$V_s(n) = V_{in}(n) V_{sg0} \qquad \text{(Equation 4)}$$

Thus, the gain from the gate to the source is nearly unity. FIG. 4 shows the sample data plot of frequency response of the ADC as a result of using a buffer circuit configured as in FIG. 3. The data plot shows that the ISI effect is removed from the frequency response.

BRIEF DESCRIPTION OF THE DRAWINGS

Embodiments of the present invention will be better understood from a reading of the following detailed description, taken in conjunction with the accompanying figures, in which like reference characters designate like elements and in which.

SUMMARY OF THE INVENTION

It would be advantageous to provide a mechanism that can offer increased voltage gain and eliminate intersymbol interference (ISI) in a buffer chain of a time-interleaved analog-to-digital converter (ADC).

Embodiments of the present disclosure include a buffer circuit (or buffer) configured to reset its output to a load to a reset voltage when the input to the buffer circuit transitions to a different level. For example, the buffer may be a constituent of a buffer chain in a time-interleaved ADC. The reset voltage is independent of the input to the buffer, and independent of the load capacitance. The buffer includes a transistor with the gate node coupled to the buffer input through a switch structure. The drain node of the transistor is coupled to a supply potential, e.g., the ground potential, and the source node outputs a buffered voltage to the load with a large load capacitance (e.g., a sub-ADC). During operation, while the input voltage transitions to a different level, the reset voltage is supplied to the buffer output at the source node to override the voltage on the loading capacitance. The reset voltage may equal to a steady state voltage at the source node when there is no input at the gate node of the transistor. A reset switch may be used to control the supply of the reset voltage to the source node. For example, the reset switch is coupled between the source node and the common mode potential of the buffer circuit. Thus, the buffer output to the load maintains at the reset voltage until the reset switch is turned off and the reset voltage is decoupled from the source node as well as the load.

Figure 1:
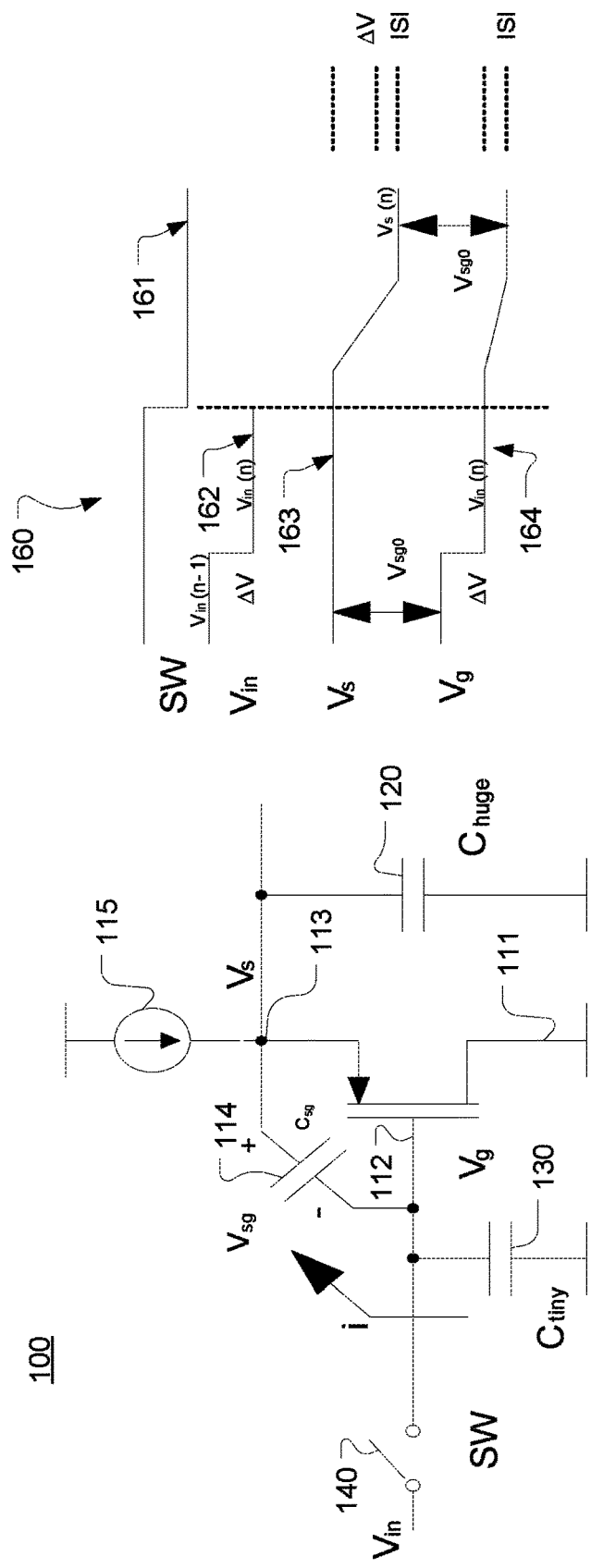
FIG. 1 illustrates the configuration of a buffer in the sampling and interleaving stage of an individual channel in a time-interleaved ADC in accordance with the prior art.
Figure 2:
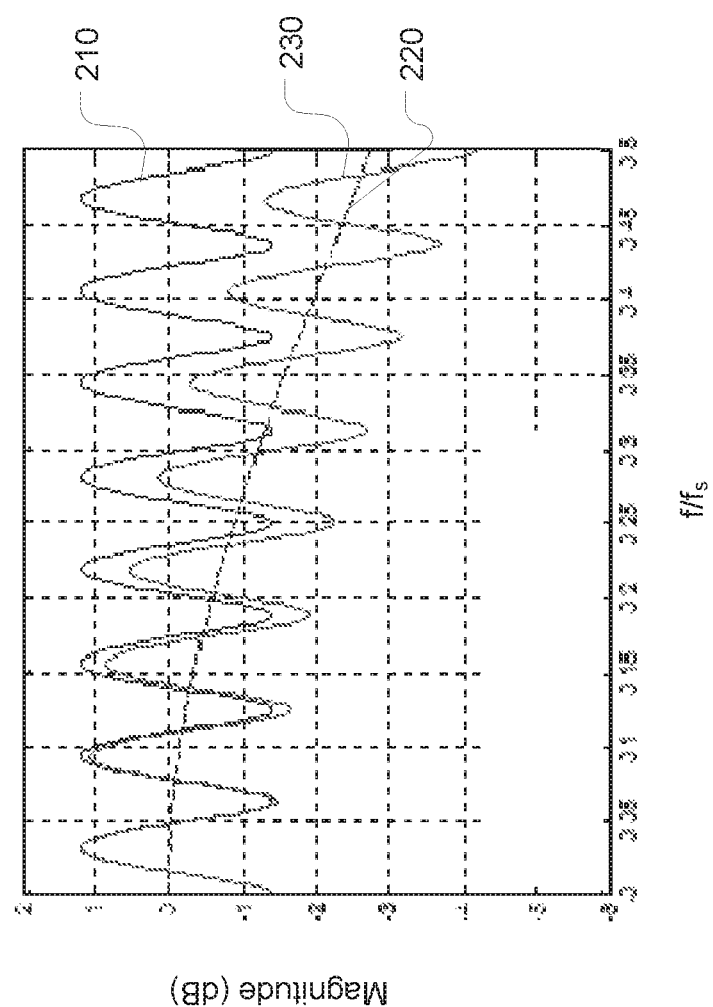
FIG. 2 illustrates sample data plots of ADC frequency responses obtained by using the buffer shown in FIG. 1.
Figure 3:
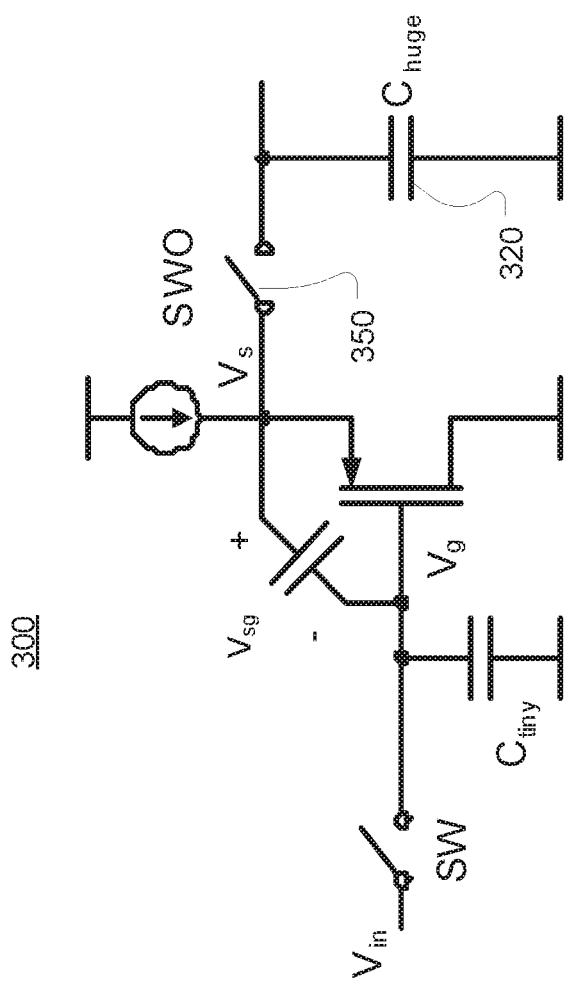
FIG. 3 illustrates the configuration of a buffer in the sampling and interleaving stage in a time-interleaved ADC where the buffer is capable of output an signal without ISI in accordance with the prior art.
Figure 4:
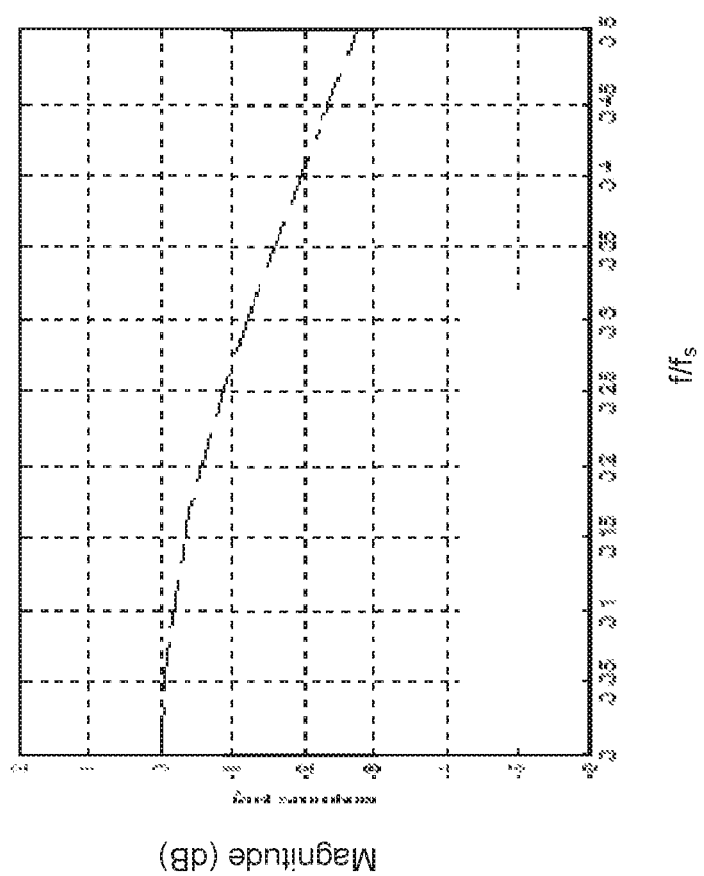
FIG. 4 shows the sample data plot of frequency response of the ADC as a result of using a buffer circuit configured as in FIG. 3.

By resetting the buffer output (or the input to the load) during level transitions of the input voltage, the ISI effect caused by the large load capacitance can be advantageously attenuated or removed. Moreover, compared to the conventional buffer circuit configuration as shown in FIG. 3, a buffer circuit according to the present disclosure can advantageously offer a voltage gain that is greater than 1.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

DETAILED DESCRIPTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. Although a method may be depicted as a sequence of numbered steps for clarity, the numbering does not necessarily dictate the order of the steps. It should be understood that some of the steps may be skipped, performed in parallel, or performed without the requirement of maintaining a strict order of sequence. The drawings showing embodiments of the invention are semi-diagrammatic and not to scale and, particularly, some of the dimensions are for the clarity of presentation and are shown exaggerated in the Figures. Similarly, although the views in the drawings for the ease of description generally show similar orientations, this depiction in the Figures is arbitrary for the most part. Generally, the invention can be operated in any orientation.

High-Speed Buffering for Time-Interleaved ADCs with Reduced ISI and Increased Voltage Gain Overall, embodiments of the present disclosure provide a voltage reset mechanism that allows a buffer to buffer the input to a large capacitive load without introducing intersymbol interference (ISI) and yet with increased voltage gain. Particularly, when the input voltage to the buffer varies to a different level, a constant reset voltage is supplied to the buffer output that is coupled to the load to override the voltage therein, thereby removing the capacitive effect from a previous output value on the load. In this fashion, an additional voltage gain can also be achieved with the gain factor being greater than 1.

A buffer circuit according to an embodiment of the present disclosure can be used in high performance sampling and interleaving stages for high speed Analog-to-Digital converters (ADCs). For instance, the ADCs may operate at a sampling frequency of several tens of GS/s. However, the present disclosure is not limited to applications related to ADCs. A buffer circuit according to an embodiment of the present disclosure can also be used in various other systems and structures, especially when the input signal to the buffer is of high speed and the load is highly capacitive, such as a sensor interface.

Figure 5:
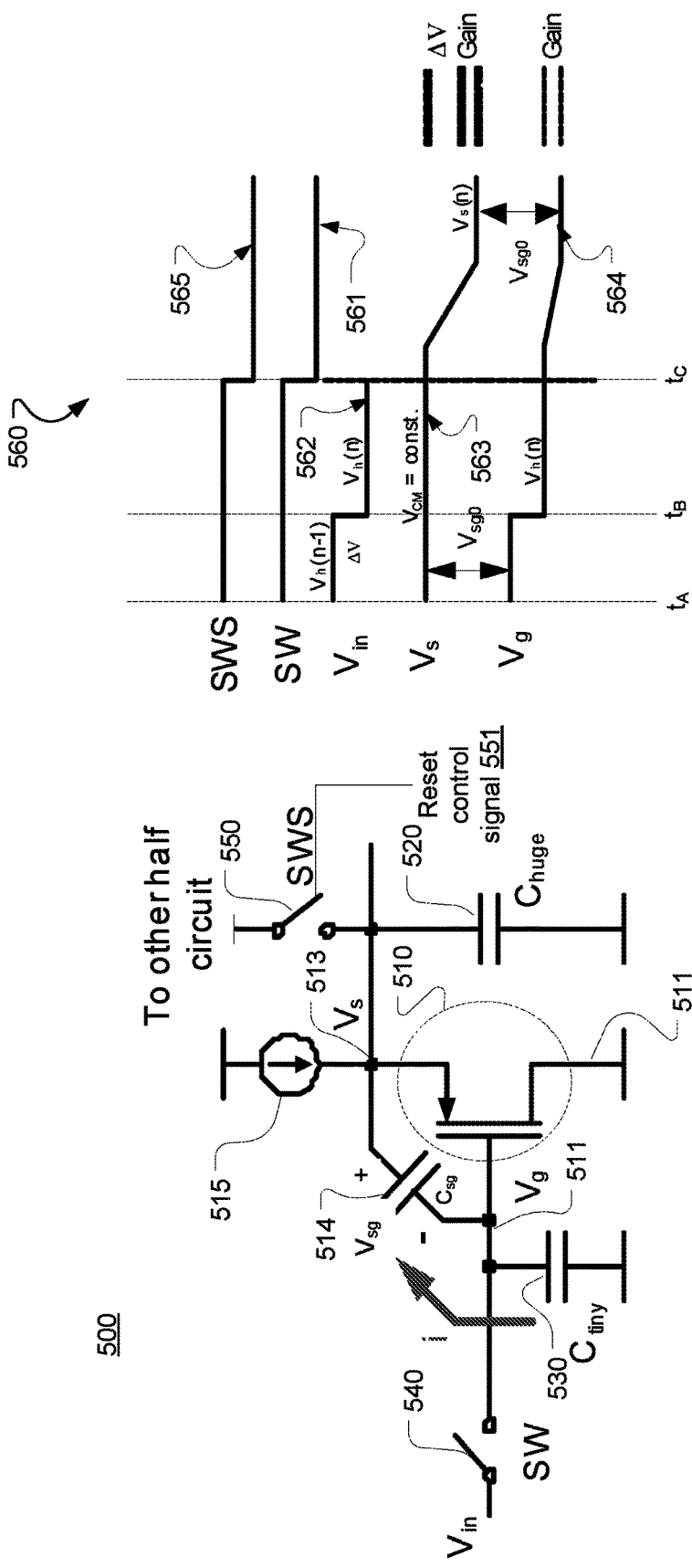
FIG. 5 illustrates the configuration of an exemplary buffer circuit capable of resetting its output to the load periodically to a predetermined voltage to prevent ISI in accordance with an embodiment of the present disclosure.

FIG. 5 illustrates the configuration of an exemplary buffer circuit 500 capable of resetting its output to the load 520 periodically to a predetermined voltage to prevent ISI in accordance with an embodiment of the present disclosure. Diagram 560 shows the timing waveforms in various components in FIG. 5. For example, the buffer 500 is a member of the buffer chain disposed in the sampling and interleaving stage in a time-interleaved ADC.

The buffer 500 may be implemented as a differential source follower including two transistors. However, only the half circuit having a PMOS transistor 510 is shown here. The full circuit is pseudo-differential with another copy that carries the inverted signal. The gate node 512 of the transistor 510 is coupled to a sampling switch 540 which represents the combination of a demultiplexer (or a set of demultiplexers) and an array of sampling and hold (S/H) switches. The drain node 511 is coupled to a supply potential, e.g., the ground potential. The source node is coupled to a current source 515 as well as a load 520 that has a large capacitance (hence represented as $C_{huge}$). The load 520 may include a bank of sub-ADCs and the interconnect network (not explicitly shown).

According to embodiments of the present disclosure, a reset switch 550 is coupled to the buffer output and controls the supply of a constant reset voltage $V_{reset}$ to the load $C_{huge}$ 520. The reset voltage may be obtained or derived in any suitable manner or from any suitable component or voltage source. In some embodiments, the reset voltage value equals the buffer output $V_s$ that is obtained when there is no input to the gate node 512.

During operation of the ADC, the input analog signal $V_{in}$ is fed to the sampling switch 540. The buffer 500 operates to buffer an input sampled voltage and output it to the load 520. More specifically, as illustrated in diagram 560, assuming that at the start of the waveforms (time $t_A$), the buffer 500 begins with a settled condition where all transients have died out and the sampling switch (SW) 540 is on. The source-to-gate voltage ($V_{gs}$) of the buffer 500 then assumes a certain value that follows from its bias current which is a positive value $V_{sg0}$. The parasitic capacitance at the gate node 512 of the transistor is relatively small and represented as $C_{tiny}$ 530.

Assuming time $t_B$ denotes the beginning of the $n_{th}$ sampling cycle of this channel, where the input voltage ($V_1$) is stepped down (as shown in the waveform 562), thus $\Delta V = V_1 - (n-1) - V_{in}(n)$ (positive number). It will be appreciated that the illustrated transition of the input voltage ($V_1$) as a step is merely exemplary and illustrative, and that the actual signal may be in a different form of variation. Before this transition, the reset switch 550 is turned on (as shown in the waveform 565) to impose the constant reset voltage $V_{reset}$ on the source node 513 of the transistor 510, thus $V_s = V_{reset}$ (as shown in the waveform 563). Because the capacitance $C_{tiny}$ at the gate node is very small, the voltage $V_g$ can follow the step of the input voltage ($V_{in}$) quickly and steps down and becomes $V_{in}(n)$ (as shown in the waveform 564).

In this fashion, despite the large loading capacitance ($C_{huge}$), the reset switch 550 allows the source node voltage $V_s$ to be maintained at the constant reset voltage $V_{reset}$ during the initial stage of the voltage transition, thereby advantageously eliminating the effect on the $V_s$ from a previous cycle (($n-1)_{th}$ cycle) and eliminating ISI related to the loading capacitance.

At time $t_C$ and during the $n_{th}$ cycle, the reset switch 550 opens (as shown in the waveform 563) and decouples the reset voltage from the load 520. In the illustrated example, the reset switch 550 operates in synchronization with the sampling switch 540 which also opens at $t_C$, as shown in the waveforms 561 and 565. However, it will be appreciated the present disclosure is not limited to such timing of the reset switch.

After time $t_C$, the source node starts to settle until it reaches $V_s(n)$, and the source-to-gate voltage returns to the same steady state value $V_{sg0}$ that it started out with at $t_A$.

As a result, the amount of charge pulled from $C_{tiny}$ is independent of the previous output value $V_s(n-1)$. In the discrete time domain, the buffer output can be represented as $$V_s(n) = V_{in}(n)(1+k) + V_{sg0} \qquad \text{(Equation 5)}$$

Thus, the buffer output at the $n_{th}$ cycle ($V_s(n)$) is independent of the output at the $(n-1)_{th}$ cycle ($V_s(n-1)$). In other words, no ISI term is contained in the buffer output $V_s$. In addition, the output voltage is advantageously amplified by a number greater than one, i.e., (k+1), where $k = C_{sg}/C_{tiny}$.

The state of the reset switch 550 may be controlled by an internal clock 551 with a predetermined clock frequency and duty cycle. For example, the reset switch 550 closes ("OFF") when the clock 551 is logic high and remains open ("ON") during the rest of the clock cycle. However, it will be appreciated that a reset switch according to the present disclosure can be controlled in any suitable manner or in any suitable type of control signal that is well known in the art. Further, the reset switch 550 can be implemented using a transistor or in any suitable manner that is well known in the art.

Figure 6:
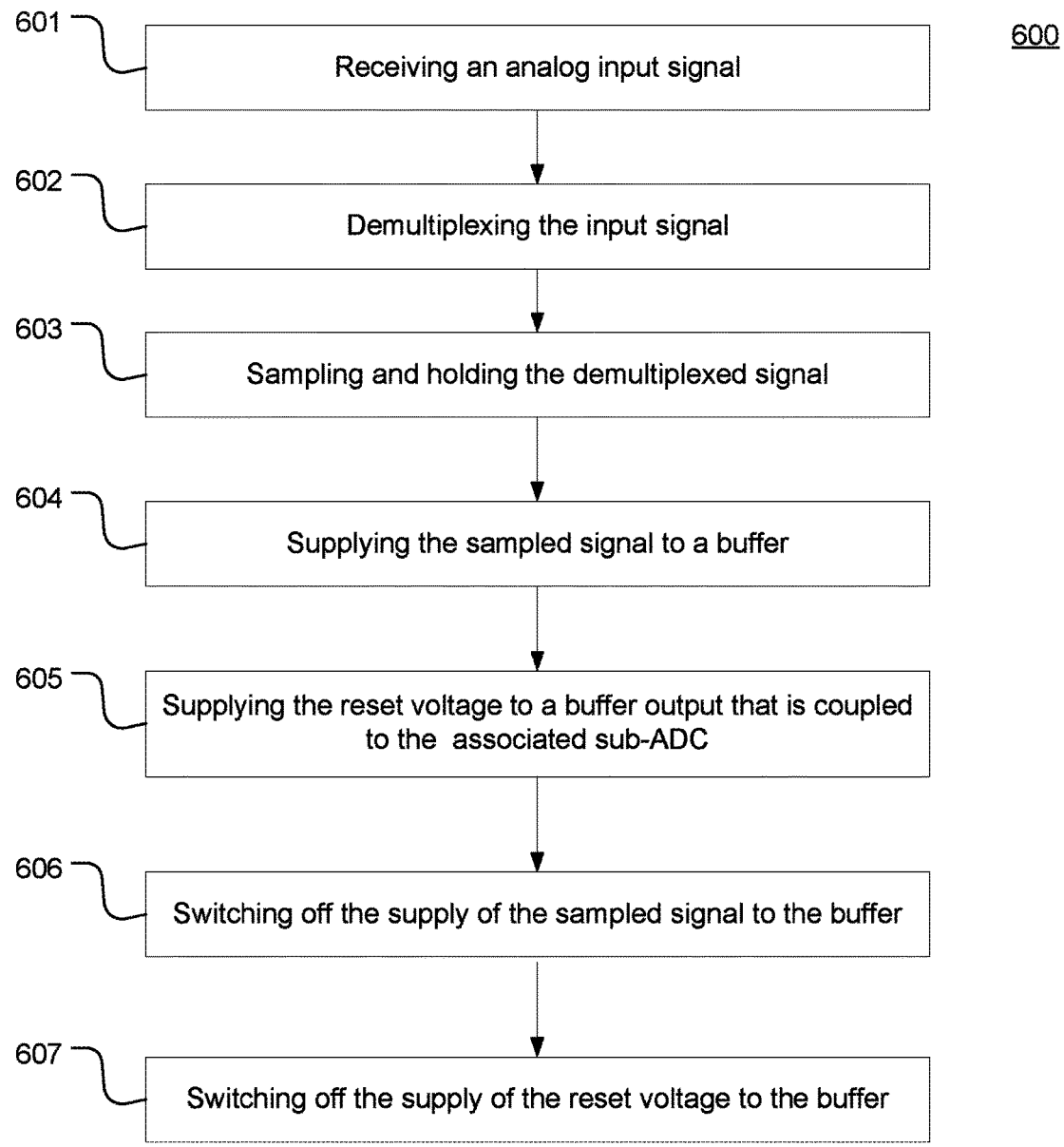
FIG. 6 illustrates the exemplary process of processing signals at a sampling and interleaving stage in a time-interleaved ADC in accordance with an embodiment of the present disclosure.
Figure 9:
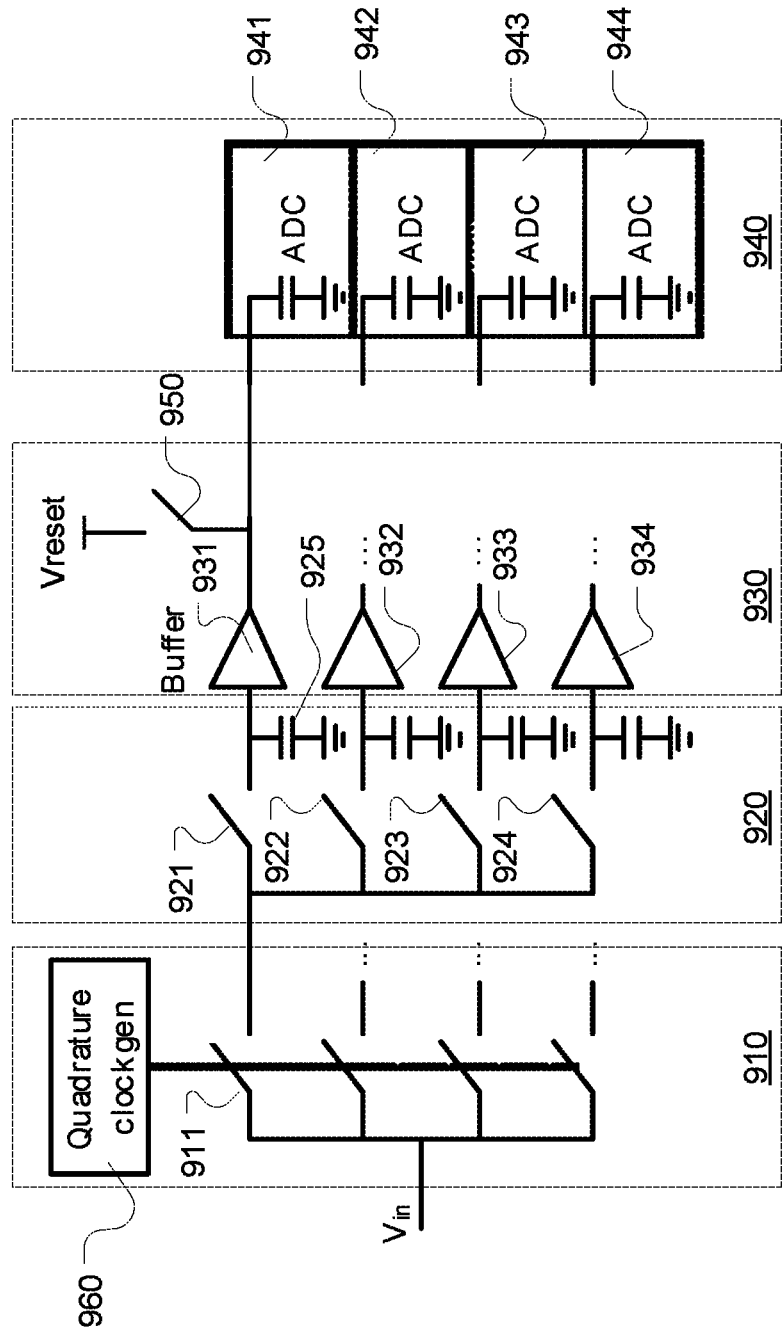
FIG. 9 illustrates the configuration of an exemplary time-interleaved ADC in accordance with an embodiment of the present disclosure.

FIG. 6 illustrates the exemplary process 600 of processing signals at a sampling and interleaving stage in a time-interleaved ADC in accordance with an embodiment of the present disclosure. The process can be performed by an ADC as shown in FIG. 9. Particularly, according to the present disclosure, in the sampling and interleaving stage, a sampled signal is buffered and then output to an associated sub-ADC, where a constant reset voltage is applied to the buffer output periodically to eliminate ISI effect.

More specifically, at 601, an analog input signal is received at the input of the ADC. The input signal may be a signal transmitted through a high speed communication link. At 602, the input signal is demultiplexed to produce demultiplexed signals for processing by the N channels in the ADC, each channel with its own track and hold (T/H) section and a sub-ADC. Thus, the sample rate of the interleaved ADC is N times the sample rate of an individual sub-ADC. At 603, at an allocated time window, the T/H in a specific channel goes from the tack-mode to the hold mode and samples a demultiplexed signal that is supplied to this channel.

At 604, the sampled signal is supplied to the input of the buffer in the channel. At 605, during each cycle, a constant reset voltage is supplied to the buffer output (the input of the load) to precharge the capacitive load and override the voltage thereon. Thereby the reset voltage removes the memory of the voltage from a previous cycle and advantageously prevents ISI at the buffer output. At 606, the supply of the sampled signal to the buffer is switched off. At 607, the reset voltage is decoupled from the buffer output. Thereafter, the buffer starts to settle until the $V_{sg}$ returns to $V_{sg0}$ as described in greater detail with reference to FIG. 5, and the buffer $V_s$ follows the input voltage at the gate node $V_g$.

Figure 7:
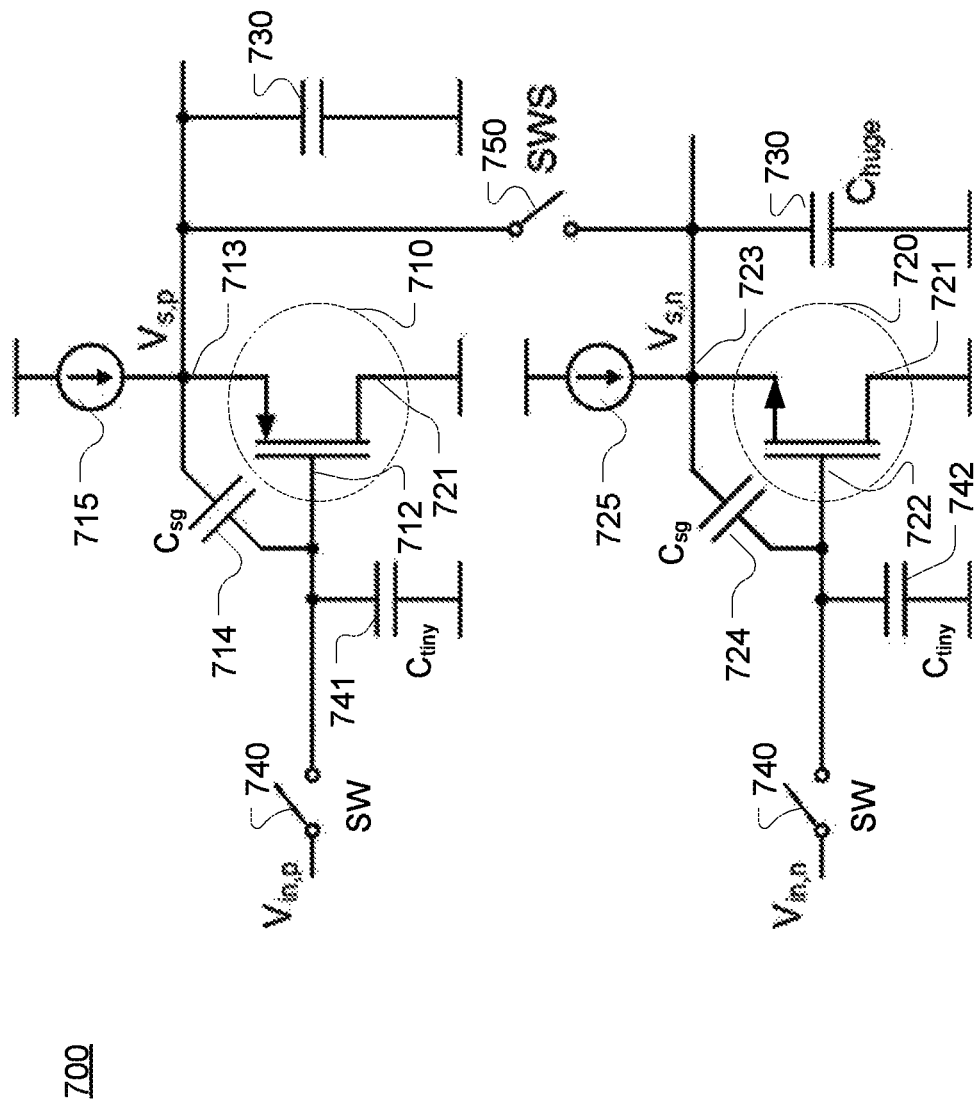
FIG. 7 illustrates the configuration of an exemplary buffer circuit based on a differential current source in accordance with an embodiment of the present disclosure.

FIG. 7 illustrates the configuration of an exemplary buffer circuit 700 based on a differential current source in accordance with an embodiment of the present disclosure. In the illustrated example, the reset voltage $V_{reset}$ corresponds to the common mode potential in the differential source follower.

More specifically, the buffer circuit 700 includes a PMOS transistor 710 and a NMOS transistor 720. $V_{in}$ is supplied to the gates nodes 712 and 722 of both transistors 710 and 720, i.e., $V_{in,p}$ and $V_{in,n}$, through the sampling switch 740. The parasitic capacitances at the gate nodes 712 and 722 are represented as $C_{tiny}$ 741 and $C_{tiny}$ 742. The gate-to-source capacitances are illustrated as $C_{sg}$ 714 and $C_{sg}$ 724. The source nodes 713 and 723 are coupled to the current sources 715 and 725, respectively, and supply the buffer output $V_{s,p}$ and $V_{s,n}$ to the load represented as $C_{huge}$ 730.

According to the present disclosure, a reset switch 750 is coupled between the PMOS source node 713 and the NMOS source node 723. Thus, when the sampling switch 740 is ON and enables the supply of the sampled signal (demultiplexed) to $V_{in,p}$ and $V_{in,n}$, the buffer output $V_{s,p}$ and $V_{s,n}$ is held at the constant common mode potential, $V_{CM}$. $V_{CM}$ serves as the reset voltage $V_{reset}$ to precharge the load capacitance to a constant value and thereby eliminate ISI at the buffer output, as described with greater detail with reference to FIG. 5.

It will be appreciated that a buffer circuit capable of resetting the buffer output and precharging the load can be implemented in any other configuration that is well known in the art without departing from the scope of the present disclosure.

Figure 8:
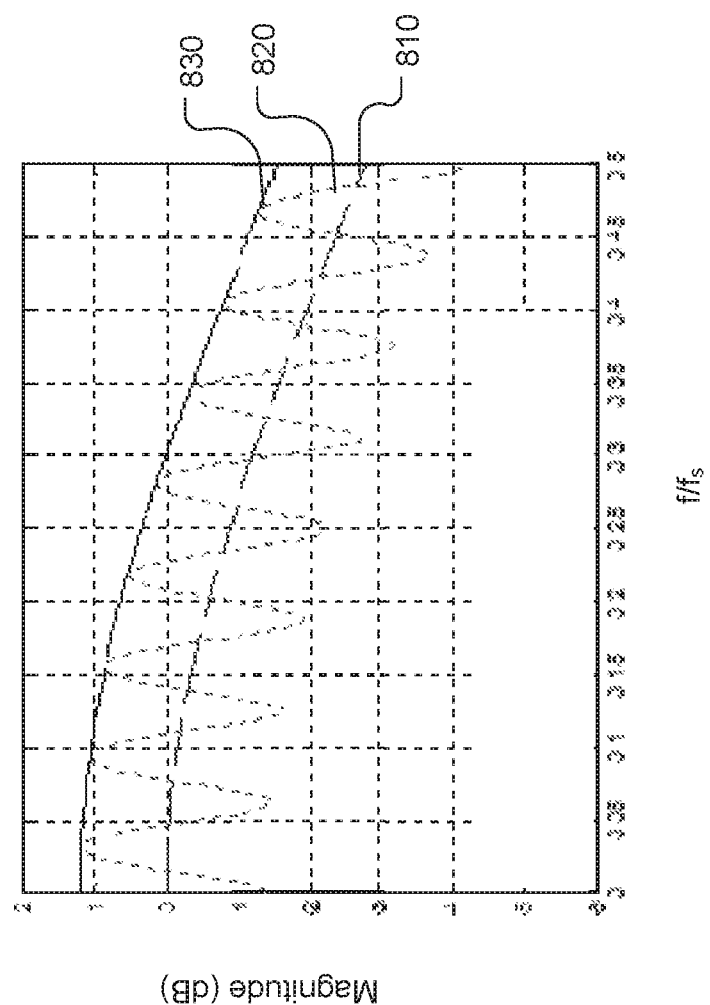
FIG. 8 illustrates sample data plots of overall ADC frequency responses obtained by using a buffer circuit in accordance with the prior art and by using a buffer circuit in accordance with an embodiment of the present disclosure.

FIG. 8 compares the overall ADC frequency responses obtained by using a conventional buffer circuit and by using an exemplary buffer circuit in accordance with an embodiment of the present disclosure. The finite bandwidth is shown in plot 810. The data plot 820 shows the overall ADC frequency response obtained by using a buffer circuit in accordance with the prior art, in which the undesirable ripples are resulted from ISI. The data plot 830 shows the overall ADC frequency response obtained by using a buffer circuit in accordance with an embodiment of the present disclosure, e.g., a buffer circuit 700 in FIG. 7. It demonstrates that ISI is eliminated from overall ADC frequency response by resetting the buffer output to the capacitive load periodically.

FIG. 9 illustrates the configuration of an exemplary time-interleaved ADC 900 in accordance with an embodiment of the present disclosure. For example, the ADC 900 is used in a high-speed data communication system and may be implemented in an integrated circuit, e.g., using CMOS logic. The ADC 900 includes an array of sub-ADCs 940 coupled to a sampling and interleaving stage which includes demultiplexing switches 910, T/H switches 920, buffers 930, and a bank of sub-ADCs 940. The sub-ADCs 940 forms a large capacitive load coupled to the buffer output. In some embodiments, the demultiplexing switches 910 and the T/H switches 920 each may be implemented in a cascaded structure or a tree structure to achieve a large bandwidth.

The input analog signal $V_{in}$ is received and demultiplexed by the demultiplexing switches 910, which are driven by the clock signals output from a quadrature clock generator 960. In this example, an individual demultiplexing switch in 910 is coupled to multiple T/H switches in 920. For example, the switch 911 controls 4 T/H switches 921-924. A respective storage capacitor is coupled to each T/H switch. For example, the capacitor 925 has one terminal coupled to the ground potential and the other terminal coupled to the T/H switch 921. The stored potential on each storage capacitor (e.g., the capacitor 925) is supplied to the input of an associated buffer (e.g., the buffer 931). In this example, each buffer in 930 buffers the sampled signal and sequentially outputs it to multiple sub-ADCs (e.g., 941-944) for analog-to-digital conversion.

According to the present disclosure, when a sampled signal is fed to the buffer, the output of the buffer or the input of a sub-ADC is reset to a constant reset voltage to eliminate ISI at this node. The reset voltage may be the constant common mode potential as shown in FIG. 7, as described in greater detail above.

It will be appreciated that a time-interleaved ADC and various components thereof can be implemented in any other suitable configurations that are well known in the art without departing from the scope of the present disclosure.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A system comprising:
a sampling circuit configured to sample an input signal;
analog-to-digital (A/D) conversion logic configured to convert said input signal to a digital signal; and
a buffer coupled between said sampling circuit and said A/D conversion logic, wherein said buffer comprises a first transistor comprising:
a gate node coupled to said sampling circuit;
a drain node coupled to a supply potential; and
a source node coupled to said A/D conversion logic, wherein said buffer is configured to receive a constant potential at said source node when said input signal is supplied from said sampling circuit to said gate node, wherein said constant potential is independent of said input signal, wherein said buffer further comprises a reset switch couple to said constant potential and configured to control a supply of said constant potential to said source node of said first transistor.

2. The system of claim 1, wherein said constant potential equals a potential at said source node of said first transistor when no signal is supplied to said gate node of said first transistor.

3. The system of claim 1, wherein: said buffer comprises a differential source follower comprising said first transistor and a second transistor, and wherein said reset switch is coupled between a source node of said second transistor and said source node of said first transistor.

4. The system of claim 1, wherein said reset switch comprises a transistor, and wherein said reset switch is controlled by a clock signal with a predetermined duty cycle.

5. The system of claim 1, wherein said sampling circuit comprises a storage capacitor configured to hold a sampled voltage of said input signal, and wherein said storage capacitor comprises:
- a first node coupled to said gate node of said first transistor; and
- a second node coupled to said supply potential, wherein said supply potential is ground potential.

6. The system of claim 1, wherein said A/D conversion logic comprises successive-approximation-register (SAR) analog-to-digital converters.

7. An analog-to-digital conversion circuit in a communication system, the analog-to-digital conversion circuit comprising:
- a sampling and interleaving circuit configured to receive an input signal;
- an array of analog-to-digital converters (ADCs) configured in a time-interleaved manner and operable to convert said input signal to a digital signal; and
- an array of buffers coupled between said sampling and interleaving circuit and said array of analog-to-digital converters (ADCs), wherein a respective buffer comprises a first transistor comprising:
  - a gate node coupled to said sampling and interleaving circuit; and
  - a source node coupled to said array of analog-to-digital converters (ADCs), wherein said buffer is configured to receive a reset potential at said source node upon said input signal being supplied from said sampling and interleaving circuit to said gate node, and wherein further said reset potential is independent of a load capacitance of said array of ADCs.

8. The analog-to-digital conversion circuit of claim 7, wherein said reset potential equals a voltage at said source node of said first transistor when no signal is supplied to said gate node of said first transistor.

9. The analog-to-digital conversion circuit of claim 7, wherein said respective buffer further comprises a reset switch configured to control a supply of said reset potential to said source node of said first transistor.

10. The analog-to-digital conversion circuit of claim 9, wherein: said respective buffer comprises a differential source follower comprising said first transistor and a second transistor, and wherein said reset switch is coupled between a source node of said second transistor and said source node of said first transistor.

11. The analog-to-digital conversion circuit of claim 10, wherein said reset potential corresponds to a common mode potential at said source node of said second transistor.

12. The analog-to-digital conversion circuit of claim 9, wherein said reset switch comprises a transistor, and wherein said reset switch is controlled by a clock signal with a predetermined duty cycle and in synchronization with said sampling and interleaving circuit.

13. The analog-to-digital conversion circuit of claim 9, wherein said first transistor further comprises a drain node coupled to a supply potential, and wherein said sampling and interleaving circuit further comprises switches and storage capacitors, wherein a respective storage capacitor comprising:
- a first node coupled to said gate node of said first transistor and a switch in said sampling and interleaving circuit; and
- a second node coupled to said supply potential.

14. The analog-to-digital conversion circuit of claim 7, wherein said array of ADCs comprises successive-approximation-register (SAR) ADCs.

15. A method of signal processing, said method comprising:
- demultiplexing an analog signal to produce a de-multiplexed signal;
- sampling said demultiplexed signal to produce a sampled signal;
- buffering said sampled signal to produce a buffered signal, wherein said buffering comprises:
  - supplying said sampled signal to a gate node of a first transistor; and
  - supplying a reset potential at a source node of a first transistor when said sampled signal is supplied to said gate node; and
- converting said buffered signal to a digital signal by using an array of analog-to-digital converters (ADCs) that are configured in a time-interleaved manner, wherein said reset potential is independent of said analog signal.

16. The method of claim 15, wherein said buffered signal has a voltage equal to a sum of a gate-source voltage and a voltage of said sampled signal multiplied by a gain, wherein said gate-source voltage is a steady state voltage across said gate node and said source node of said first transistor, and wherein further said gain is greater than 1.

17. The method of claim 15, wherein said buffering is performed by a differential source follower comprising said first transistor and a second transistor, and wherein said reset potential corresponds to a common mode potential at a source node of said second transistor.

18. The method of claim 15, wherein said supplying said reset potential comprises switching on a reset switch in accordance with a predetermined clock signal, wherein said reset switch is coupled between said source node of said second transistor and said source node of said first transistor.

19. The method of claim 18, wherein said reset potential equals a common mode voltage at said source node of said first transistor when no signal is supplied to said gate node of said first transistor.

* * * * *